United States Patent [19]

Sato et al.

[11] Patent Number: 4,623,933
[45] Date of Patent: Nov. 18, 1986

[54] VIDEO CAMERA GAIN CONTROL CIRCUIT

[75] Inventors: Joichi Sato, Atsugi; Ryuji Shiono, Machida; Tsutomu Nimura, Hiratsuka; Toshiaki Isogawa; Mitsuru Sato, both of Atsugi, all of Japan

[73] Assignee: Sony Corporation, Tokyo, Japan

[21] Appl. No.: 566,390

[22] Filed: Dec. 28, 1983

[30] Foreign Application Priority Data

Jan. 7, 1983 [JP] Japan .................................... 58-860

[51] Int. Cl.$^4$ ............................................. H01N 5/26
[52] U.S. Cl. .................................... 358/228; 330/254; 358/174
[58] Field of Search ............... 358/217, 209, 174, 228; 330/254, 257

[56] References Cited

U.S. PATENT DOCUMENTS

| | | | |
|---|---|---|---|
| 3,445,590 | 5/1969 | Discnert et al. | 358/228 |
| 4,174,526 | 11/1979 | Geurts | 358/219 |
| 4,293,822 | 10/1981 | McFadyen | 330/254 |
| 4,365,272 | 12/1982 | Nagai | 358/228 |
| 4,410,915 | 10/1983 | Yamamoto | 358/228 |
| 4,466,018 | 8/1984 | Soneda et al. | 358/213 |
| 4,470,067 | 9/1984 | Mino | 358/174 |

Primary Examiner—Robert G. Lev
Attorney, Agent, or Firm—Lewis H. Eslinger; Alvin Sinderbrand

[57] ABSTRACT

A circuit for controlling the gain of an amplifier typically used in a video camera has a automatic gain control circuit to provide the camera output signal within predetermined limits and a switch to permit exclusion of the automatic gain control feature and the use of a manually variable gain control having a greater range and overlapping that of the automatic gain control to provide further flexibility to the user of the camera so that objects normally too bright or too dark to be accommodated within the range of the automatic gain control circuit can be recorded. Differential amplifiers operating in conjunction with current mirror circuits are provided in both the variable gain amplifier circuit and in the circuit that provides the gain control signal thereto to provide a gain control circuit that lends itself to integrated circuit fabrication.

13 Claims, 2 Drawing Figures

VIDEO CAMERA GAIN CONTROL CIRCUIT

BACKGROUND OF THE INVENTION

1. Field of the Invention

This invention relates to automatic gain control circuitry and, specifically, to gain control circuitry for use with a video camera.

2. Description of the Prior Art

Most video cameras intended for general use employ an automatic gain control (AGC) circuit for controlling the gain of the detected luminance signal output. Such AGC circuits operate to maintain the level of the luminance signal at a specific level regardless of the brightness of the object being viewed by the video camera. One benefit of using an AGC circuit to maintain the luminance signal at this specific AGC level is to improve the quality of the picture by maintaining a desirable signal-to-noise ratio. Nevertheless, situations do arise in which a picture of a dark object, for example, is desired to be recorded, even though it is acknowledged that the resultant pictures of such dark object will be less than optimum. Moreover, video cameras have now advanced beyond the utilitarian stage to the point where artistic uses are being made with video tape reproductions and, thus, the capability should be provided to the user to capture images which are either brighter or darker than what would be considered standard exposures.

OBJECTS AND SUMMARY OF THE INVENTION

Accordingly, it is an object of the present invention to provide an automatic gain control circuit for use in video cameras, which can overcome the above-noted defects inherent in the prior art.

Another object of this invention is to provide an improved automatic gain control circuit, which has a manual override switch to permit the taking of video pictures that would otherwise not be possible using automatic gain control circuitry.

Another object of this invention is to provide an improved gain control circuit including an amplifier whose gain is controllable, so as to capture pictures of objects that are too dark or too light and which would otherwise be precluded by the automatic gain control circuit.

In accordance with an aspect of the present invention, an automatic gain control circuit is provided for a video camera in which a manually operated switch is provided so that, upon operation of the switch to a manual gain control situation from an automatic gain control situation, the range of gain in the luminance signal amplifier can be broadened for manual control and narrowed for automatic control. A gain control signal is developed which is manually variable and an automatic gain control signal is developed which is automatically variable, and a switch is provided for selecting one or the other of the gain control signals to be fed back to the luminance signal amplifier to control the gain.

The above and other objects, features, and advantages of the present invention will become apparent from the following detailed description of an illustrative embodiment thereof to be read in conjunction with the accompanying drawings, in which like references designate the same elements and parts.

DETAILED DESCRIPTION OF EMBODIMENTS

Figure 1:
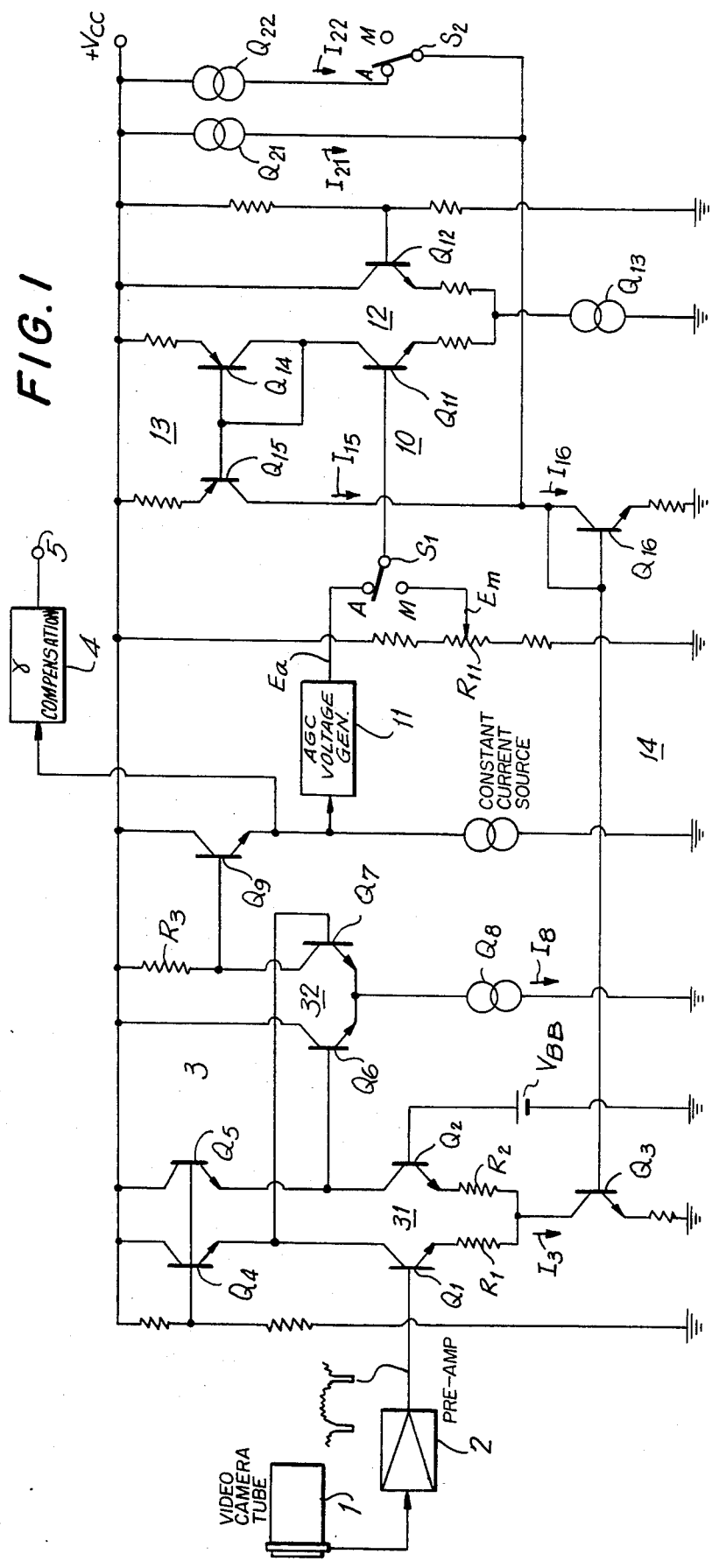
FIG. 1 is a schematic circuit diagram of a video camera amplifier and gain control circuit according to one embodiment of the present invention.

In the circuit of FIG. 1, a luminance signal as might be produced by a typical video camera tube 1 is fed through preamplifier 2 to variable gain amplifier 3 that comprises a first differential amplifier 31, which includes a pair of transistors $Q_1$ and $Q_2$ having their emitter circuits mutually connected through resistors $R_1$ and $R_2$. The junction of resistors $R_1$ and $R_2$ is connected to the collector circuit of transistor $Q_3$ which, is connected as a current source and its emitter is connected to ground potential through an appropriate resistor in the conventional fashion. The resistors $R_1$ and $R_2$ of differential amplifier 31 typically have the same resistance values.

The luminance signal from preamplifier 2 is fed to the base lead of transistor $Q_1$ and the base lead of the other transistor $Q_2$ of the differential amplifier 31 is maintained at a predetermined voltage $V_{BB}$, which is typically chosen as the pedestal level of the luminance signal, the waveform of the typical luminance signal is well known and has the pedestal voltage derived from the DC clamping level, which is necessary to reinsert any DC voltages lost when the signal is passed through RC-coupled stages. The collector leads of the first differential-amplifier transistors $Q_1$ and $Q_2$ are connected directly to the emitter leads of a second pair of transistors $Q_4$ and $Q_5$, respectively. Transistors $Q_4$ and $Q_5$ are connected as current-to-voltage converting transistors and have their respective base circuits connected to the bias voltage $V_{CC}$. Additionally, the collector leads of transistors $Q_1$ and $Q_2$ of first differential amplifier 31 are connected to a second differential amplifier 32. More specifically, the collector lead of transistor $Q_1$ is connected to the base lead of transistor $Q_7$ and the collector lead of transistor $Q_2$ is connected to the base lead of transistor $Q_6$, transistors $Q_6$ and $Q_7$ thereby forming second differential amplifier 32. The collector circuit of transistor $Q_7$ is the output of the second differential amplifier 32, which is taken off resistor $R_3$ that is connected to the biasing voltage $V_{CC}$. The collector lead of transistor $Q_7$ is also fed to the base lead of transistor $Q_9$ which is connected in an emitter-follower configuration with the output thereof being fed to a gamma-compensation circuit 4. Transistor $Q_9$ is connected in an emitter-follower configuration by having its emitter circuit connected to ground through a constant current source and taking the output signal from that emitter circuit. The luminance signal is then gamma compensated in accordance with well-known techniques in gamma-compensation circuit 4 and provided at output terminal 5. Accordingly, the path of the luminance signal from the preamplifier 2 is through a first differential amplifier 31 and a second differential amplifier 32 and through emitter follower transistor $Q_9$ to the gamma-compensation circuit 4 and is thus available at output terminal 5.

Luminance signal gain control circuitry 10 controls the gain, either manually or automatically, of the variable gain amplifier 3. The luminance signal that is fed to the gamma-compensation circuit 4 from the output of emitter-follower transistor $Q_9$ is also fed as an input to an automatic-gain-control voltage generator 11, in which the luminance signal is detected and smoothed so that an automatic-gain-control voltage $E_a$ is derived, which has a DC level corresponding to the luminance signal. The automatic-gain-control voltage $E_a$ is supplied to a first fixed contact A of switch $S_1$, and a second fixed contact M of switch $S_1$ is connected to the wiper arm of potentiometer $R_{11}$ forming part of a voltage divider connected between the bias voltage $V_{CC}$ and ground. Thus, operation of potentiometer $R_{11}$ will cause a manually variable voltage $E_m$ to be present at fixed terminal M of switch $S_1$.

The output of switch $S_1$, which selects the automatic gain control mode as being either automatic or manual, is connected to the base lead of transistor $Q_{11}$, which together with transistor $Q_{12}$ forms differential amplifier 12. The emitter leads of transistors $Q_{11}$ and $Q_{12}$ are connected through respective resistors to current source $Q_{13}$, which is also connected to ground. The collector of transistor $Q_{11}$ is connected to a current-mirror circuit 13, comprised of transistors $Q_{14}$ and $Q_{15}$ connected in the well-known current-mirror configuration. The output of differential amplifier 12 is taken off through this current-mirror circuit 13 by transistor $Q_{15}$ as current $I_{15}$. The collector circuit of transistor $Q_{15}$, through which current $I_{15}$ flows, is connected to the collector lead of transistor $Q_{16}$, the base lead of which is connected to transistor $Q_3$ to form another current-mirror circuit 14.

The collector circuits of transistors $Q_{15}$ and $Q_{16}$ are also connected respectively to a constant-current source $Q_{21}$ and to the selector arm of switch $S_2$. A fixed contact A of switch $S_2$ is connected to a constant current source $Q_{22}$ and a second fixed contact M of switch $S_2$ is left unconnected. Contact A corresponds to the automatic gain control mode and contact M to the manual gain control mode of the circuit of FIG. 1. Note that the current-mirror circuit 14 controls the current $I_3$ flowing through the first differential amplifier 31 of luminance amplifier 3.

In the operation of the inventive gain control circuit 10 of FIG. 1, the gain $A_3$ of the variable gain amplifier 3 can be represented as:

$$A_3 = [R_3/(R_1+R_2)](I_8/I_3) \qquad (1)$$

where $I_8$ is the current flowing from constant current source $Q_8$, and $I_3$ is the collector current of the transistor $Q_3$. Because transistors $Q_{14}$ and $Q_{15}$ are connected as a current-mirror circuit, the collector current $I_{15}$ of transistor $Q_{15}$ is the same as the collector current of transistor $Q_{11}$, therefore, the collector current $I_{15}$ will correspond directly with any variations of the base voltage of transistor $Q_{11}$. When switches $S_1$ and $S_2$ are set to the automatic gain control mode, that is, are set to the A terminals, current $I_{15}$ will correspond with the automatic gain control voltage $E_a$, because the automatic gain control voltage $E_a$ is supplied to the base lead of transistor $Q_{11}$. Now, the collector current $I_{16}$ of transistor $Q_{16}$ can be represented by the following:

$$I_{16} = I_{15} + I_{21} + I_{22} \qquad (2)$$

where $I_{21}$ and $I_{22}$ are the currents produced by constant current sources $Q_{21}$ and $Q_{22}$, respectively. On the other hand, however, because transistors $Q_{16}$ and $Q_3$ are connected to form a current-mirror circuit then $I_{16}$ must equal $I_3$ and, $$I_{16} = I_3 \qquad (3)$$

is obtained.

Therefore, based upon equations (1), (2) and (3) above it can be seen that:

$$A_3 = [R_3/(R_1+R_2)][I_8/(I_{15}+I_{21}+I_{22})] \qquad (4)$$

Equation (4) demonstrates that the automatically controlled gain $A_3$ decreases as current $I_{15}$ increases. This results in a corresponding decrease in gain $A_3$ as the automatic gain control voltage $E_a$ increases, because the current $I_5$ and the automatic gain control voltage $E_a$ correspond directly, as explained hereinabove. This means that a luminance signal having a substantially constant level can be obtained at output terminal 5, regardless of the brightness of the object that is the subject of the picture under consideration.

Figure 2:
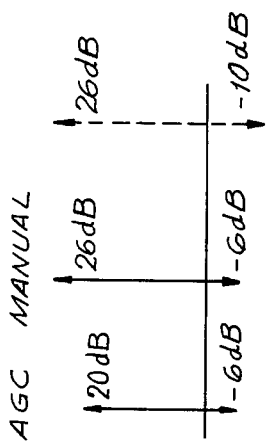
FIG. 2 is a graphical representation of the signal gains provided by the variable gain amplifier and gain control circuit of FIG. 1.

FIG. 2 graphically represents the limits on the variable amplifier gain $A_3$ when the gain control circuit 10 shown in FIG. 1 is operating in the automatic mode, specifically, the left-most arrow AGC in FIG. 2 shows that the gain of amplifier 3 can be varied by the automatic gain control circuit from 6 dB down up to a gain of 20 dB. This may be seen from reviewing equation (4) and assuming that current $I_{15}=0$ then equation (4) becomes:

$$A_a(\max) = [R_3/(R_1+R_2)][I_8/(I_{21}+I_{22})] \qquad (5)$$

Assuming typical values of resistance and by choosing the appropriate constant current sources, equation (5) can yield a maximum gain of 20 dB in the automatic mode.

In the manual gain control mode, that is, when switches $S_1$ and $S_2$ are set to terminal M, then voltage $E_m$ is supplied to the base circuit of transistor $Q_{11}$, and the current source $Q_{22}$ is taken out of the circuit. Thus, the value of current $I_{16}$ can be determined as:

$$I_{16} = I_{15} + I_{21} \qquad (6)$$

and utilizing equations (2), (3), and (6) above the gain can be determined as:

$$A_3 = [R_3/(R_1+R_2)][I_8/(I_{15}+I_{21})] \qquad (7)$$

Thus, because current $I_{15}$ corresponds to the level of the voltage $E_m$, the gain $A_3$ can be controlled manually by adjusting potentiometer $R_{11}$.

The variation of gain $A_3$ that is possible in the manual mode is shown by the center arrow in FIG. 2, that is, the gain can be varied from 6 dB down up to 26 dB. During the adjustment of the potentiometer $R_{11}$, when the value of $E_m$ is made small, transistor $Q_{11}$ will turn off and become non-conductive, therefore, current $I_{15}$ will become 0 and the gain $A_3$ will become:

$$A_m(\max) = [R_3/(R_1+R_2)][I_8/I_{21}] \qquad (8)$$

Assuming typical values of resistance and by choosing the appropriate constant current sources, equation (8) can yield a maximum gain of 26 dB in the manual mode. Note that the value of the maximum gain in the manual mode is larger than that possible in the automatic mode. Thus, when it is desired to take a picture of an object that is quite dark and would require an amplification gain greater than that which could be provided by the automatic gain control circuit 10, a picture of such dark object can be obtained by switching the inventive gain control circuit from the automatic mode (switches $S_1$ and $S_2$ set to contacts A) to the manual mode (switches $S_1$ and $S_2$ set to contacts M).

Additionally, the range of gain can be increased even further in the manual mode by broadening the range of voltage $E_m$, as shown by the dashed line to the right in FIG. 2 having a gain for amplifier 3 going from 10 dB down up to 26 dB. This lower swing in gain will permit overly bright objects to be recorded, and this broadened range can be achieved by reversing the connections to the contacts in switch $S_2$, that is, connecting the constant current source $Q_{22}$ to the M contact and leaving the A contact unconnected. This will result in lowering the minimum gain of the gain control circuit so that a picture of an object which is brighter than that permitted by the automatic gain control circuit can be taken by switching out of the automatic mode and into the manual mode. Thus, the invention also permits the use of a video camera to obtain a luminance signal when the principal object is of a brightness requiring a gain that is outside the typical range of the automatic gain control circuitry.

Although illustrative embodiments of the present invention have been described in detail above with reference to the accompanying drawing, it is to be understood that the invention is not limited to those precise embodiments, and that various changes and modifications can be effected therein by one skilled in the art without departing from the spirit and scope of the invention, as defined by the appended claims.

What is claimed is:

1. Apparatus for amplifying an information signal of varying level, comprising:
    variable gain amplifier means receiving said information signal for amplifying said signal by a gain that is variable within first and second ranges in response to a gain control signal having a corresponding first or second value range and producing an amplified information signal, said second range being partially coextensive with and exceeding said first range;
    feedback means connected to said amplified information signal for producing a feedback gain signal;
    manually variable means for producing a manual gain signal;
    means for producing a fixed, minimum gain control signal;
    switching means including a first switch connected to said feedback gain signal and said manual gain signal for selecting one or the other thereof as an output and a second switch selectively connecting as an output said fixed gain control signal, said first and second switches cooperating to select either said first or second value range for said gain control signal; and
    gain control means connected to said outputs of said first and second switches for producing therefrom said gain control signal having said first or second value range fed to said variable gain amplifier means, such that said information signal is amplified by a gain within either said first or second ranges in response to said gain control signal, in which said variable gain amplifier means includes first and second differential transistor amplifiers, said first differential transistor amplifier being connected to ground potential through a current mirror circuit and said current mirror circuit being connected to receive said gain control signal for varying a gain of said first differential transistor amplifier within said first or second range in response to a magnitude of current flowing in said current mirror circuit, and in which said means for producing a fixed gain control signal comprises constant current source means selectively connected to said current mirror circuit through said second switch for selectively causing a predetermined fixed current component to flow through said current mirror circuit.

2. Apparatus for amplifying an information signal according to claim 1, in which said feedback means includes an automatic gain control voltage generator connected to an output of said variable gain amplifier means for producing therefrom an output signal having a voltage level corresponding to said amplified information signal and being fed to said switching means.

3. Apparatus for amplifying an information signal according to claim 1, in which said manually variable means comprises a voltage source connected to a manually operable potentiometer for producing said manual gain signal as a voltage having a level corresponding to an operable position of said potentiometer.

4. Apparatus for amplifying an information signal according to claim 1, in which said gain control means includes a differential transistor amplifier connected to said output of said first switch and a current mirror circuit connected to the output of said differential transistor amplifier, whereby an output current of said current mirror circuit forms a component of said gain control signal fed to said variable gain amplifier means.

5. Apparatus for amplifying an information signal according to claim 1, in which said information signal is a color video luminance signal and further comprising a gamma-compensation circuit connected to said variable gain amplifier means for producing a gamma-compensated amplified luminance signal therefrom.

6. Video camera apparatus comprising;
    image pick-up tube means producing an image output signal;
    preamplifier means for increasing a level of said image signal and producing a preamplified image signal;
    variable gain amplifier means connected for amplifying said preamplified image signal by a gain variable within at least first and second selectable ranges in response to a gain control signal and producing an amplified image signal, in which said first and second ranges are partially coextensive, with said second range exceeding said first range;
    feedback means connected to said amplified image signal for producing a feedback voltage signal therefrom;
    variable resistance means operably connected to produce a manual voltage signal in response to manual operation thereof;
    a source of a constant, non-zero gain control signal; and
    gain control means having said feedback voltage signal, said manual voltage signal, and said constant gain control signal connected to inputs thereof for producing said gain control signal from a selected combination of said inputs, said gain control signal being fed to said variable gain amplifier means for selecting said first or second range, whereby said gain thereof is responsive to said feedback voltage signal and said constant control signal to vary within said first range when said amplified image signal is within preset limits and said gain is responsive to said manual voltage signal to vary within said second range when said amplified image signal exceeds said preset limits, in which said variable gain amplifier means includes first and second differential transistor amplifiers, said first differential transistor amplifier being connected to ground potential through a current mirror circuit having a variable current output responsive to said gain control signal from said gain control means for altering a gain of said first differential transistor amplifier in response thereto and in which said source of a constant, non-zero gain control signal includes a constant current source selectively connected to said current mirror circuit through said second swtich for selectively causing a predetermined fixed current component to flow through said current mirror circuit.

7. Video camera apparatus according to claim 6, in which said gain control means includes switch means connected to provide as an output a selected combination of said feedback voltage signal, said manual voltage signal, and said constant control signal.

8. Video camera apparatus according to claim 7, in which said switch means includes a first switch connected to provide at an output either said feedback voltage signal or said manual voltage signal, and in which said gain control means further includes a differential transistor amplifier connected to said output of said first switch, and a current mirror circuit connected as an output stage of said differential amplifier for producing a component of said gain control signal.

9. Video camera apparatus according to claim 6, further comprising a gamma-compensation circuit having a non-linear output response characteristic and receiving said amplified output signal for altering the amplitude thereof in correspondence with said non-linear output response characteristic.

10. Apparatus for amplifying a video luminance signal of varying level, comprising:
variable gain amplifier means receiving said luminance signal and amplifying said luminance signal by a gain that is variable over first and second selectable ranges of gain in response to a gain control signal for producing an amplified luminance signal, in which said first and second ranges are paritally coextensive, with said second range exceeding said first range;
voltage generator means connected to said amplified luminance signal for producing a corresponding feedback voltage signal;
manually variable voltage means for producing a variable manual voltage signal;
a constant current source producing a constant current signal;
switching means connected to said feedback voltage signal, said manual voltage signal, and said constant current signal for selecting a combination thereof as an output; and
gain control means connected to said output of said switching means for producing therefrom said gain control signal fed to said variable gain amplifier means, such that said luminance signal is amplified by a gain variable within either said first or second ranges of gain in response to said gain control signal, in which said variable gain amplifier means includes first and second differential transistor amplifiers, said first differential transistor amplifier being connected to ground potential through a current mirror circuit and said current mirror circuit being connected to receive said gain control signal for varying a gain of said first differential transistor amplifier in response thereto and in which said constant current source is connected to said current mirror circuit through said switching means for causing a predetermined current to flow through said current mirror circuit.

11. Apparatus for amplifying a video luminance signal according to claim 10, in which said manually variable voltage means comprises a voltage source connected to a manually operable potentiometer for producing said manual voltage signal as a voltage having a level corresponding to an operable position of said potentiometer.

12. Apparatus for amplifying a video luminance signal according to claim 10, in which said gain control means includes a differential transistor amplifier having an input selectively connected by said switching means to either said feedback voltage signal or said manual voltage signal and an output connected to a current mirror circuit for producing a component of said gain control signal fed to said variable gain amplifier means.

13. Apparatus for amplifying a video luminance signal according to claim 10, further comprising a gamma-compensation circuit connected to said variable gain amplifier means for producing a gamma-compensated amplified luminance signal.

* * * * *